United States Patent
Mori et al.

(12)

(10) Patent No.: US 6,392,741 B1
(45) Date of Patent: May 21, 2002

(54) PROJECTION EXPOSURE APPARATUS HAVING ACTIVE VIBRATION ISOLATOR AND METHOD OF CONTROLLING VIBRATION BY THE ACTIVE VIBRATION ISOLATOR

(75) Inventors: Futoshi Mori; Masato Takahashi, both of Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/476,211

(22) Filed: Dec. 30, 1999

Related U.S. Application Data

(63) Continuation of application No. 09/315,951, filed on May 21, 1999, now abandoned, which is a continuation of application No. 08/866,249, filed on Jun. 5, 1997, now abandoned, which is a continuation-in-part of application No. 08/707,216, filed on Sep. 3, 1996, now Pat. No. 5,812,420.

(30) Foreign Application Priority Data

| Sep. 5, 1995 | (JP) | ............................................. 7-251887 |
| Sep. 5, 1995 | (JP) | ............................................. 7-251888 |
| Jun. 7, 1996 | (JP) | ............................................. 8-168366 |
| Jun. 7, 1996 | (JP) | ............................................. 8-168367 |

(51) Int. Cl.$^7$ ......................... G03B 27/42; F16M 13/00
(52) U.S. Cl. ......................... 355/53; 356/400; 248/550; 248/638
(58) Field of Search .............................. 355/53, 72, 75, 355/55; 700/280; 356/399, 400, 401; 248/550, 638; 250/491.1

(56) References Cited

U.S. PATENT DOCUMENTS

| 4,525,659 A | 6/1985 | Imahashi et al. ............ 318/649 |
| 4,821,205 A | 4/1989 | Schutten et al. ............. 364/508 |
| 5,187,519 A | 2/1993 | Takabayashi et al. .......... 355/53 |
| 5,528,118 A | 6/1996 | Lee ......................... 318/568.17 |
| 5,539,497 A | 7/1996 | Nishi ........................... 355/53 |
| 5,610,686 A * | 3/1997 | Osanai ......................... 355/53 |
| 5,663,783 A | 9/1997 | Ueda ............................ 355/53 |
| 5,686,991 A | 11/1997 | Yamazaki .................... 356/358 |
| 5,699,145 A | 12/1997 | Makinouchi et al. .......... 355/53 |
| 5,737,063 A | 4/1998 | Miyachi ........................ 355/53 |
| 5,767,948 A | 6/1998 | Loopstra et al. ............... 355/53 |
| 5,812,420 A | 9/1998 | Takahashi .................... 248/550 |
| 5,874,820 A * | 2/1999 | Lee ............................. 318/575 |
| 5,953,105 A * | 9/1999 | Engelen et al. ................ 355/53 |

FOREIGN PATENT DOCUMENTS

| WO | WO 96/38765 | 12/1996 |

* cited by examiner

*Primary Examiner*—Alan A. Mathews
(74) *Attorney, Agent, or Firm*—Morgan, Lewis & Bockius LLP

(57) ABSTRACT

A projection exposure apparatus transferring a pattern from a reticle to a wafer includes at least three vibration isolating pads, a vibration isolating stand on the vibration stand, a plurality of actuators driving the vibration isolating stand in a vertical direction, at least two stages over the vibration isolating stand, the stages mounting the wafer and the reticle, at least one displacement sensor at the vibration isolating stand and detecting a displacement of the vibration isolating stand, at least one acceleration sensor at the vibration isolating stand and detecting an acceleration and deceleration of the vibration isolating stand, a vibration control system coupled to the displacement sensors and the acceleration sensors, and controlling the actuators based on outputs of the displacement sensors and the acceleration sensor, a position measuring device positioned on the vibration isolating pads and measuring a position of the stages, and a vibration compensating system coupled to the vibration control system and receiving a command value to cancel a reaction force caused by the acceleration and deceleration of the stages in advance.

44 Claims, 5 Drawing Sheets

PROJECTION EXPOSURE APPARATUS HAVING ACTIVE VIBRATION ISOLATOR AND METHOD OF CONTROLLING VIBRATION BY THE ACTIVE VIBRATION ISOLATOR

This is a continuation of application, application Ser. No. 09/315,951 filed on May 21, 1999, now abandoned, which is a continuation of application Ser. No. 08/866,249 filed on Jun. 5, 1997, now abandoned, which is a continuation-in-part of application Ser. No. 08/707,216 filed on Sep. 3, 1996, now U.S. Pat. No. 5,812,420 issued on Sep. 22, 1998. This application hereby incorporates by reference application Ser. Nos. 09/315,951 and 08/866,249.

BACKGROUND OF THE INVENTION

1. Field of the Invention

The present invention relates to a projection exposure apparatus, and more particularly, to a projection exposure apparatus having an active vibration isolator and a method of controlling vibration by the active vibration isolator. Although the present invention is suitable for a wide scope of applications, it is particularly suitable for suppressing vibration caused by the movement of stages in the projection exposure apparatus.

2. Discussion of the Related Art

As a higher precision is desired in high-precision instruments such as a step-and-scan type exposure apparatus (so-called "stepper"), it has been necessary to isolate micro-vibrations generated on the base plate (or vibration isolating stand) of the apparatus from the installation floor at the micro-G level (very small level). Conventionally, mechanical dampers and pneumatic dampers have been used as vibration isolating pads to support the vibration isolating stand in the vibration isolators. The vibration isolating pads also have a function for centering the vibration isolators. The mechanical dampers consist of coil springs placed in a damping liquid. Pneumatic dampers may include an air spring. When a spring constant of the air spring is set at a small value, the vibrations exceeding approximately 10 Hz can be isolated. Accordingly, such vibration isolators are widely used for the support of precision instruments.

Recently, active vibration isolators have been proposed in order to overcome the inherent limits in the aforementioned passive vibration isolators. The active vibration isolators detect the vibration of the vibration isolating stand by sensors, and control the vibration by driving actuators based on the output of the sensors. The active vibration isolators thus are capable of providing an effective vibration isolation without significant vibrations in the low-frequency control region.

In conventional steppers, an XY stage (wafer stage) undergoing a large acceleration and deceleration is mounted on the base plate held by the vibration isolating pads. When the XY stage moves, the reaction force accompanying with the acceleration and deceleration of the XY stage causes the main body of the exposure apparatus to vibrate. To compensate for the vibration, in the active vibration isolator, a force having the same magnitude in the opposite direction as the reaction force accompanying the acceleration or deceleration of the stage is inputted in advance. In this case, six accelerometers measuring a movement in six degrees of freedom are attached to the main body of the exposure apparatus. Since a counterforce is applied during acceleration of deceleration of the stages, a mechanical resonance is excited in the main body of exposure apparatus so that the main body will vibrate at this frequency.

Moreover, when the amount of movement of the stage becomes larger because of the large acceleration or mass of the stage, vibration in the main body of the exposure apparatus (mainly in the rotational direction with respect to the Z-axis) changes the initial stage position. As a result, the amount of movement in the acceleration and mass of the stage will become even larger in successive operations. Accordingly, the amounts of vibration will lead to the failure of the equipment eventually when the vibration is not controlled precisely.

SUMMARY OF THE INVENTION

Accordingly, the present invention is directed to a projection exposure apparatus having an active vibration isolator and a method of controlling vibration by the active vibration isolator that substantially obviate one or more of the problems due to limitations and disadvantages of the related art.

An object of the present invention is to provide a projection exposure apparatus having an active vibration isolator and a method of controlling vibration by the active vibration isolator regardless of the stage movement.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the penned drawings.

To achieve these and other advantages and in accordance with the purpose of the present invention, as embodied and broadly described, a projection exposure apparatus transferring a pattern on a reticle to a wafer includes at least three vibration isolating pads, a vibration isolating stand on the vibration isolating pads, a plurality of actuators driving the vibration isolating stand in a vertical direction, at least two stages over the vibration isolating stand, the stages mounting the wafer and the reticle, at least one displacement sensor at the vibration isolating stand and detecting a displacement of the vibration isolating stand, at least one acceleration sensor at the vibration isolating stand and detecting an acceleration and deceleration of the vibration isolating stand, a vibration control system coupled to the displacement sensors and the acceleration sensors, and controlling the actuators based on outputs of the displacement sensors and the acceleration sensor, a position measuring device positioned on the vibration isolating pads and measuring a position of the stage, and a vibration compensating system coupled to the vibration control system and receiving a command value to cancel a reaction force caused by the acceleration and deceleration of the stages in advance.

In another aspect of the present invention, a projection exposure apparatus transferring a pattern on a reticle to a wafer, the projection exposure apparatus having an active vibration isolator to isolate the apparatus from an vibration, the apparatus includes a plurality of isolation pads supporting the projection exposure apparatus, a vibration isolating stand on the isolation pads, a plurality of actuators driving the vibration isolating stand in a vertical direction, the actuators being below the vibration isolating stand, a plurality of stages mounting the wafer and reticle over the vibration isolating stand, a plurality of laser interferometer coupled to the stages and monitoring movements of the substrate and reticle, a plurality of acceleration sensors detecting an acceleration of the vibration isolating stand, the acceleration sensors positioned at the vibration isolating stand, a plurality of metal plates at the vibration isolating stand, a plurality of displacement sensors detecting a displacement of the vibration isolating stand, the displacement sensors facing into the metal plates, and an actuator control system controlling the actuators based on output signals from the displacement sensors and the acceleration sensors.

In a further aspect of the present invention, a method of controlling a vibration in a projection exposure apparatus, includes converting output signals from a plurality of displacement sensors and acceleration sensors into a displacement and acceleration in a center of gravity of the projection exposure apparatus with a plurality of degrees of freedom, respectively, calculating positional deviations and speed deviations of the projection exposure apparatus based on the displacement and acceleration, controlling a plurality of actuators through positional and speed controllers based on the positional and speed deviations, and inputting command values in advance into the positional and speed controllers to cancel a reaction force generated by a movement of wafer and reticle stages.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
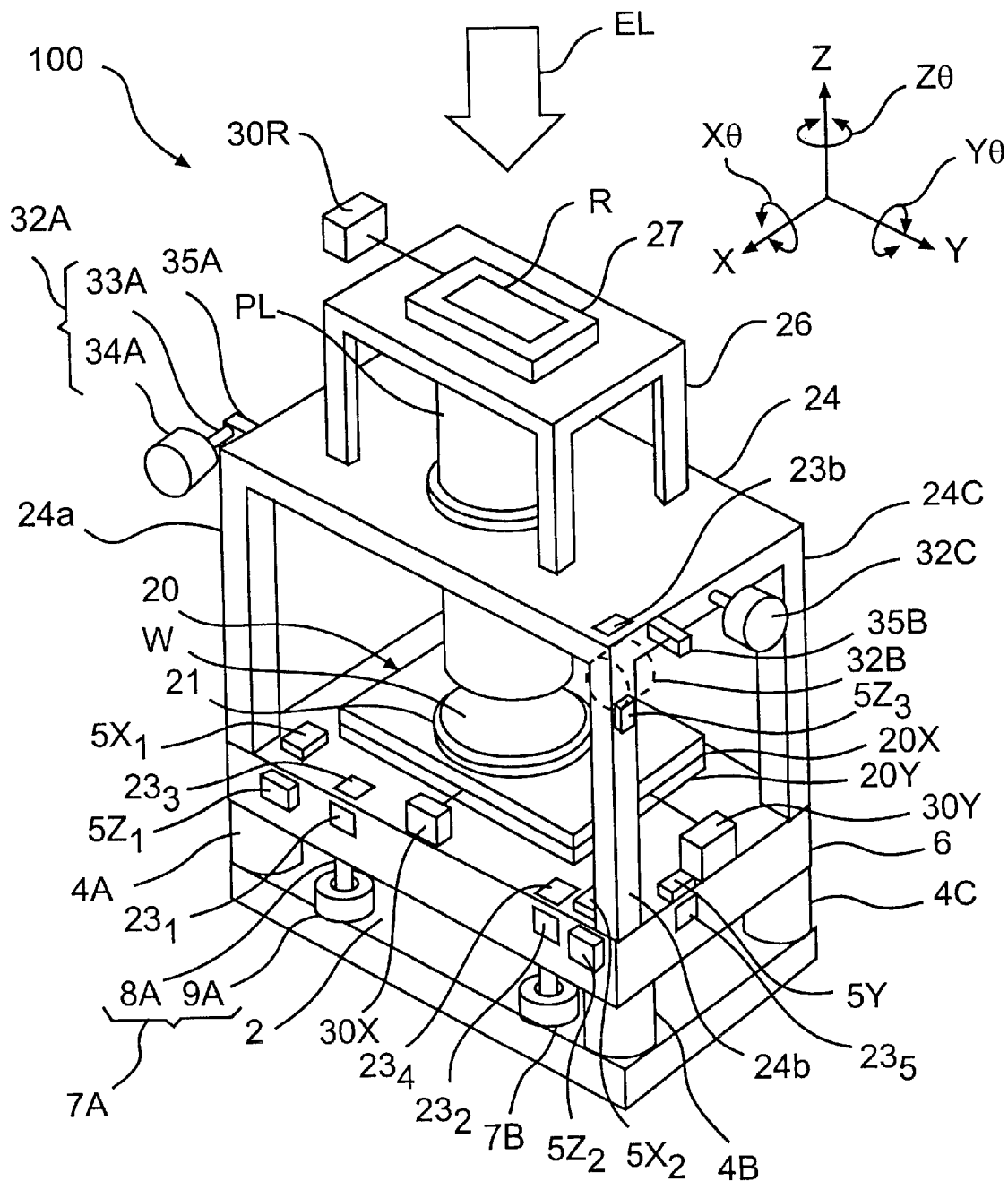
FIG. 1 is a perspective view illustrating a step-and-scan type exposure apparatus of a preferred embodiment of the present invention.

FIG. 1 is a perspective view of a step-and-scan type exposure apparatus 100 of a preferred embodiment of the present invention. Referring to FIG. 1, a rectangular plate-form pedestal 2 is installed on the installation surface of the apparatus. Vibration isolating pads 4A through 4D (the vibration isolating pad 4D is not shown) are installed on the pedestal 2. A rectangular base plate 6 is installed as a vibration isolating stand on the vibration isolating pads 4A through 4D. A projection optical system PL is used in the exposure apparatus 100 of the present invention. As shown in an indicator, the Z-axis is taken parallel to the optical axis of the projection optical system PL, the Y-axis is taken in the direction of length of the base plate 6 in the plane perpendicular to the Z-axis, and the X-axis is taken in the direction perpendicular to the Y and Z-axis. Rotational directions with respect to the X, Y, and Z axis are defined as the X$\theta$, Y$\theta$ and Z$\theta$. The directions indicated by the arrows indicating the X, Y and Z axis in FIG. 1 will be referred to as the +X +Y and +Z directions, while the opposite directions will be distinguished from these directions as the −X, −Y and −Z.

The vibration isolating pads 4A through 4D are respectively positioned in the four edges of the bottom surface of the rectangular base plate 6. Pneumatic dampers, for example, are used as the vibration isolating pads 4A through 4D. Since the heights of the vibration isolating pads 4A through 4D can be adjusted by means of air pressure, the pneumatic dampers also serve as a height adjusting mechanism. It would also be possible to install a separate height adjusting mechanism, and to use mechanical dampers with compression coil springs immersed in a damping liquid, for example as the vibration isolating pads.

Figure 2:
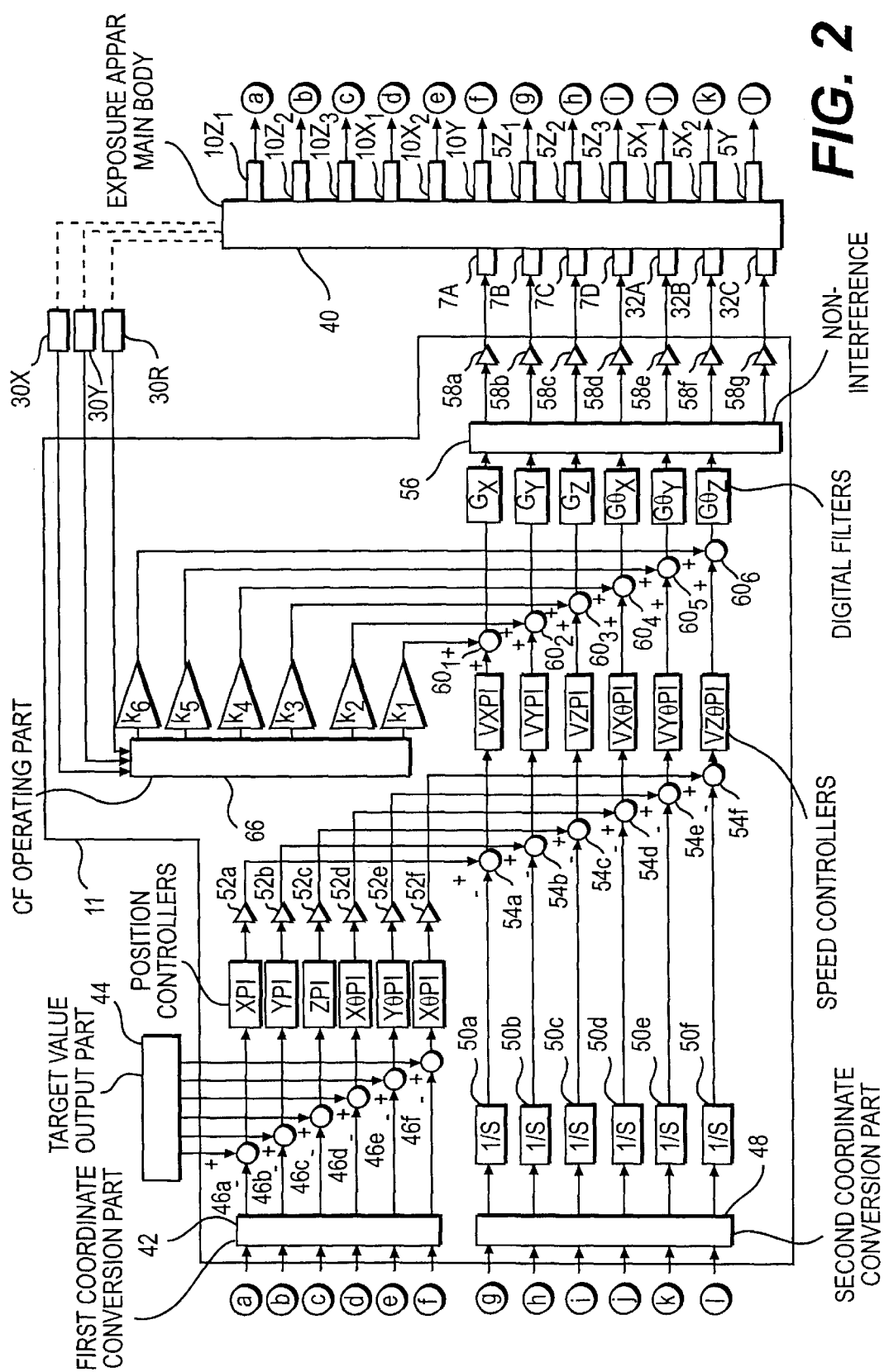
FIG. 2 is a block diagram illustrating an actuator control system controlling actuators shown in FIG. 1.

Actuators 7A and 7B are installed between the pedestal 2 and the base plate 6. The actuator 7A includes a fixed element 9A consisting of a magnetic body fastened on the top surface of the pedestal 2 and a movable element 8A containing a coil attached on the bottom surface of the base plate 6. In response to a control device 11 (not shown in FIG. 1; see FIG. 2), the actuator 7A generates a driving force in Z-direction from the pedestal 2 to the bottom surface of the base plate 6 or an attractive force toward the pedestal 2 from the bottom surface of the base plate 6. The actuators 7B through 7D are also installed with the vibration isolating pads 4B through 4D (the actuators 7C and 7D are not shown in FIG. 1). The respective driving forces and attractive forces for the actuators 7B through 7D are also set by means of the control device 11. (FIG. 2). The method of controlling the actuators 7A through 7D will be described later.

Acceleration sensors $5Z_1$ and $5Z_2$ attached to the side surface of the base plate 6 in the +Y direction detect the acceleration of the base plate 6 in the Z direction. Acceleration sensors $5X_1$ and $5X_2$ attached to the corner of the top surface of the base plate 6 in the +Y direction detect the acceleration of the base plate 6 in the X direction, and an acceleration sensor 5Y attached to the edge of the upper right surface of the base plate 6 detects the acceleration of the base plate 6 in the Y direction. For example, semiconductor type acceleration sensors can be used as the acceleration sensors $5Z_1$, $5Z_2$, $5X_1$, $5X_2$ and 5Y. Outputs of the acceleration sensors $5Z_1$, $5Z_2$, $5X_1$, $5X_2$ and 5Y are also inputted into the control device 11.

Rectangular metal $23_1$ and $23_2$ consisting of a conductive material are pasted to the side surface of the base plate 6 in the +Y direction. Rectangular metal plates $23_3$ and $23_4$ are also positioned at the edge portion of the top surface of the base plate 6 in the +Y direction. A non-conductive ceramic base plate is used as the base plate 6, and displacement sensors $10X_1$ and $10X_2$ (shown in FIG. 2) detecting the displacement of the base plate in the X direction are installed in positions facing the metal plates $23_1$ and $23_2$. For example, eddy current displacement sensors can be used as the displacement sensors $10X_1$ and $10X_2$. In the eddy current displacement sensors, an AC voltage is applied to a coil wound around an insulator. When the coil approaches an object of measurement consisting of a conductive material (conductor), an eddy current is generated in the conductor by the AC magnetic field created by the coil. The magnetic field generated by the eddy current is oriented in the opposite direction from the magnetic field generated by the coil current. Since two magnetic fields are superimposed, they change the strength and phase of the current flowing through the coil. The variation in the current is increased as the object of measurement approaches to the coil and decreased as recedes from the coil. Accordingly, the position and displacement of the object of measurement can be identified by an electrical signal out of the coil. Electrostatic capacitance type non-contact displacement sensors can also be used as displacement sensors. The electrostatic capacitance type non-contact displacement sensors detect the distance between the sensor and the object of measurement by utilizing the principal that an electrostatic capacitance is inversely proportional to the distance between the sensor and the object of measurement. Alternatively, semiconductor optical position detectors (PSD) can be used if the effects of the background light is blocked in the system.

Displacement sensors $10Z_1$ and $10Z_2$ (not shown in FIG. 1; see FIG. 2) consisting of eddy current displacement sensors detecting the displacement of the base plate 6 in the Z direction are installed facing to the metal plates $23_3$ and $23_4$.

A metal plate 23, attached to the upper side surface of the based plate 6 located in the +X direction. A displacement sensor 10Y (not shown in FIG. 1; see FIG. 2) consisting of an eddy current displacement sensor detecting the displacement of the base plate 6 in the Y direction is installed to face to the metal plate $23_5$. Outputs of the displacement sensors $10X_1, 10X_2, 10Z_1, 10Z_2$ and 10Y are also sent to the control device 11 (not shown in FIG. 1; see FIG. 2).

A wafer stage 20 driven in the X and Y directions by a driving means (not shown) is positioned on the base plate 6. The wafer stage 20 includes a wafer Y-axial stage (hereafter referred to as a "WY stage") 20Y moving over the base plate 6 in the direction of the Y-axis, and a wafer X-axial stage (hereafter referred to as a "WX stage") 20X moving over the WY stage 20Y in the direction of the X-axis. A water W, for example, a photosensitive substrate, is held by vacuum suction on the WX stage via a Z leveling stage, a θ stage (neither the Z leveling stage nor the θ stage is shown in the figures) and a wafer holder 21.

Lower columns 24 consisting of 24a, 24b, 24c, and 24d are installed in an upright position on the surface of the base plate 6 to surround the wafer stage 20, and the projection optical system PL is fastened to the central portion of the upper plate of the column 24.

Upper columns 26 are installed in an upright position on the upper plate of the lower columns 24. The upper columns 26 surround the projection optical system PL, and a reticle R (constituting a mask) is carried on the central portion of the upper plate of the second column 26 via a reticle stage 27.

Position of the WX stage 20X in the Y direction caused by the movement of the WY stage 20Y is measured by a Y-axis laser interferometer 30Y and a position of the WX stage 20X in the X direction is measured by an X-axis laser interferometer 30X. Outputs of the laser interferometers 30Y and 30X are inputted into the control device 11 and a main control device (not shown). A Z leveling stage drives the wafer stage 20 in the direction of the Z-axis and adjusts the inclination with respect to the Z-axis, and a θ stage adjusts in a micro-rotation. Accordingly, the wafer W can be positioned in three dimension by means of the wafer stage 20, Z leveling stage and θ stage.

The reticle stage 27 is constructed for a fine adjustment of the reticle R in the direction of the X-axis and adjustment of the angle of rotation of the reticle R. The reticle stage 27 can also be driven in the Y direction by a driving means (not shown). Position of the reticle stage 27 in the Y direction is measured by a reticle laser interferometer 30R, and output of the reticle laser interferometer 30R is also inputted into the control device 11 and the main control device.

An illumination optical system (not shown) is installed above the reticle R, and an image of the pattern on the reticle R projected via the projection optical system PL is successively exposed in the respective shot areas of the wafer W under an illuminating light EL for exposure (from the illumination optical system PL) while the relative positioning (alignment) of the reticle R and the wafer W and the auto-focusing of a focal point detection system (not shown) are performed by the main control device. In the present embodiment, the wafer stage 20 and reticle stage 27 are driven to scan simultaneously along the direction of the Y-axis (i.e., the scan direction) by the main control device via the respective driving means during the exposure of the respective shot areas.

The lower columns 24 consisting of columns 24a to 24d are constructed on the surface of the base plate 6 (the column 24d is not shown). An acceleration sensor $5Z_3$ detecting an acceleration of the lower columns 24 in the Z direction is attached to the side surface of the column 24b in the +Y direction. For example, a piezo-resistance type or electrostatic capacitance type semiconductor acceleration sensor can be used as the acceleration sensor $5Z_3$. Output of the acceleration sensor $5Z_3$ is also inputted into the control device 11 (shown in FIG. 2).

A metal plate $23_6$ is pasted to the corner of the upper surface of the upper plate on the lower column 24 in the +Y and +X directions. A displacement sensor $10Z_3$ (shown in FIG. 2) consisting of an eddy current displacement sensor detecting the displacement of the lower columns 24 in the Z direction installed facing to the metal plate $23_6$.

A movable shaft 35A is embedded in the side surface of the lower columns 24 located in the −Y direction, and an actuator 32A is installed between the movable shaft 35A and a supporting column (not shown) fastened to the floor surface. Like the actuator 7A, the actuator 32A includes a fixed element 34A (consisting of a magnetic body) fastened to the supporting column (not shown) and a movable element 33A (containing a coil) attached to the movable shaft 35A. A force can be applied to the movable shaft in the X direction by adjusting the current flow to the coil inside of the movable element 33A from the control device 11. Similarly, a movable shaft 35B is embedded in the side surface of the lower columns 24 located in the +Y direction, and an actuator 32B having a construction similar to that of the actuator 32A is installed between the movable shaft 35B and a supporting column (not shown) fastened to the floor surface. In this case, a force can also be applied to the movable shaft 35B in the X direction in accordance with the control device 11. An actuator 32C having a construction similar to that of the actuator 32A is installed between the central portion of the side surface of the lower columns 24 in the +Y direction and a supporting column (not shown) on the floor surface. A force can be applied to the lower columns 24 in the Y direction through the actuator 32C in accordance with the control device 11. A method of controlling the actuators 32A to 32C by the control device 11 will be described later.

Here, the adjustment of the height and horizontal level of the base plate 6 at the time of installation of the exposure apparatus 100 will be briefly described as follows. Specifically, the displacement of the base plate 6 in the Z direction (i.e., the height of the base plate 6) measured by the displacement sensors $10Z_1, 10Z_2$ and $10Z_3$ is transmitted to the control system (not shown) controlling the vibration isolating pads 4A through 4D. On the basis of the data from the displacement sensors $10Z_1$, $10Z_2$ and $10Z_3$, the control system calculates the heights of the respective vibrations isolating pads 4A through 4D to maintain the height of the base plate 6 and the horizontal level of the base plate 6 with a present value. The control system then sets the heights of the vibration isolating pads 4A through 4D with the respective calculated heights. Afterward, the heights of the vibration isolating pads 4A through 4D are maintained with the respective set values. As a result, no strain is generated in the base plate 16, and the positioning precision of the wafer stage 20 on the base plate 16 can be maintained at a constant level.

In the exposure apparatus 100 of the present invention, an exposure apparatus main body 40 (shown in FIG. 2) includes the base plate 6, wafer stage 20, wafer holder 21, lower columns 24, projection optical system PL, upper columns 26, and reticle stage 27.

The control system for the actuators 7A through 7D and 32A through 32C to isolate the exposure apparatus main body 40 from the vibration will be described with reference to the block diagram shown in FIG. 2 with an emphasis on the control device 11.

The control device 11 has a vibration control system controlling the actuators 7A, 7B, 7C, 7D, 32A, 32B and 32C based on outputs of the displacement sensors $10Z_1$, $10Z_2$, $10Z_3$, $10X_1$, $10X_2$ and $10Y$, and the acceleration sensors $5Z_1$, $5Z_2$, $5Z_3$, $5X_1$, $5X_2$ and $5Y$ to suppress the vibration of an exposure apparatus main body 40 including the base plate 6.

More specifically, the vibration control system includes a first coordinate conversion part 42, a second coordinate conversion part 48, a counterforce operating part (CF operating part) 66, a target value output part 44, and a non-interference calculating part. The counterforce operating part (CF operating part) 66 acting as a vibration compensating system predicts the vibration of the exposure apparatus main body 40 caused by the movements of the wafer stage 20 and the reticle stage 27. The counterforce operating part 66 also calculates the vibration in advance and inputs the values into vibration control system as an optimal counterforce acting on the exposure apparatus main body 40 against acceleration or deceleration of the stages. The counterforce operating part 66 also serves as a so-called "scan counter."

The first coordinate conversion part 42 receives the respective outputs of the displacement sensors $10Z_1$, $10Z_2$, $10Z_3$, $10X_1$, $10X_2$ and $10Y$ through respective A/D converters (not shown), and converts the outputs into amounts of displacement ($x,y,z,\theta_x, \theta_y, \theta_z$) of the center of gravity G of the exposure apparatus main body 40 in directions with six degrees of freedom (X, Y, Z, X$\theta$, Y$\theta$, Z$\theta$; see FIG. 1). Six subtractors 46a through 46f calculate positional deviations for respective directions in six degrees of freedom ($\Delta x=x_o-x, \Delta y=y_o-y, \Delta z=z_o-z, \Delta\theta_x=\theta_{xo}-\theta_x, \Delta\theta_y=\theta_{yo}-\theta_y, \Delta\theta_z=\theta_{zo}-\theta_z$). The calculation is based on the subtraction of the amounts of displacement ($x,y,z,\theta_x,\theta_y,\theta_z$) of the center of gravity G in directions of six degrees of freedom after the conversion made by the first coordinate conversion part 42 from target values ($x_o,y_o,z_o,\theta_{xo},\theta_{yo},\theta_{zo}$) for the position of the center of gravity in directions of six degrees of freedom inputted from a target value output part 44.

Position controllers XPI, YPI, ZPI, X$\theta$PI, Y$\theta$PI and Z$\theta$PI are for respective direction in six degrees of freedom. PI controllers constituting the position controllers perform a control operation using the positional deviations $\Delta x, \Delta y,$ $\Delta z, \Delta\theta_x, \Delta\theta_y$ and $\Delta\theta_z$ for respective directions with six degrees of freedom as operating signals). A second coordinate conversion part 48 receives the respective outputs of the acceleration sensors $5Z_1$, $5Z_2$, $5Z_3$, $5X_1$, $5X_2$ and $5Y$ through respective A/D converters (not shown), and converts the outputs into accelerations (x", y",z",$\theta_x$",$\theta_y$",$\theta_z$") of the center of gravity G in directions of six degrees of freedom. Integrators 50a through 50f integrate the accelerations x",y",z",$\theta_x$",$\theta_y$" and $\theta_z$" of the center of gravity G in directions of six degrees of freedom after the conversion made by the second coordinate conversion part 48 and convert the accelerations into speeds x',y',z',$\theta_x$',$\theta_y$' and $\theta_z$' of the center of gravity G in the respective directions. Speed conversion gain controls 52a through 52f convert the outputs of the position controllers XPI, YPI, ZPI, X$\theta$PI, Y$\theta$PI and Z$\theta$PI into respective speed command values $x_o',y_o',z_o',\theta_{xo}',\theta_{yo}'$ and $\theta_{zo}'$. Six subtractors 54a through 54f calculate deviations for respective directions of six degrees of freedom ($\Delta x'=x_o'-x', \Delta y'=y_o'-y', \Delta z'=z_o'-z', \Delta\theta_{x'=\theta xo}'-\theta_x', \Delta\theta_y'=\theta_{yo}'-\theta_y', \Delta\theta_z'=\theta_{zo}'-\theta_z'$) by respectively subtracting the outputs x',y',z',$\theta_x$',$\theta_y$' and $\theta_z$' of the integrators 50a through 50f from the speed command values $x_o',y_o',z_o',\theta_{xo}',\theta_{yo}'$ and $\theta_{zo}'$ following the conversion. Speed controllers VXPI, VYPI, VZPI, VX$\theta$PI, VY$\theta$PI and VZ$\theta$PI for respective directions in six degrees of freedom. PI controllers constituting the speed controllers perform a control operation using the speed deviations $\Delta x',\Delta y',\Delta z', \Delta\theta_x',\Delta\theta_y'$ and $\Delta\theta_z'$ for respective directions in six degrees of freedom as operating signals. A non=interference calculating part 56 performs non-interference calculations to convert the speed control amounts for directions in six degrees of freedom calculated by the controllers into speed command values to be generated at the positions of the respective actuators. Digital filters Gx, Gy, Gz, G$\theta_x$, G$\theta_y$, and G$\theta_z$ further proceed the speed control amounts executed in the PI controllers. Driving force gain controls 58a through 58g convert the speed command values generated at the positions of the respective actuators into driving forces to be generated by the respective actuators after the conversions made by the non-interference calculating part 56.

The vibration control system of the present invention is a multiple-loop control system which has a speed control loop including acceleration sensors, integrators and speed controllers, as an internal loop inside of a position control loop including displacement sensors and position controllers.

Furthermore, the counterforce operating part 66 monitors the values measured by the laser interferometers 30X, 30Y and 30R, and calculates the vibration of the exposure apparatus main body 40 to be generated by the movement of the wafer stage 20 and reticle stage 27. In this case, the vibration causes the fluctuation in the positions of the respective stages. The counterforce operating part 66 thus predicts the reaction force generated by the movement of the respective stages. Based on the results of the calculations, the counterforce operating part 66 calculates optimal counterforce command values for the respective directions in six degrees of freedom for suppressing vibration, especially for yawing (rotation about the Z-axis), of the exposure apparatus main body 40. The counterforce operating part 66 then applies gains $k_1$, $k_2$, $k_3$, $k_4$, $k_5$ and $k_6$ in the respective directions determined by the positional relationships between the position of the center of gravity G of the apparatus main body and the respective stages. Subsequently, the values are inputted to the vibration control system via adders $60_1$, $60_2$, $60_3$, $60_4$, $60_5$ and $60_6$ installed in the respective output stages of the speed controllers VXPI, VYPI, VZPI, VXθPI, VYθPI AND VZθPI for the directions in six degrees of freedom.

Figure 3:
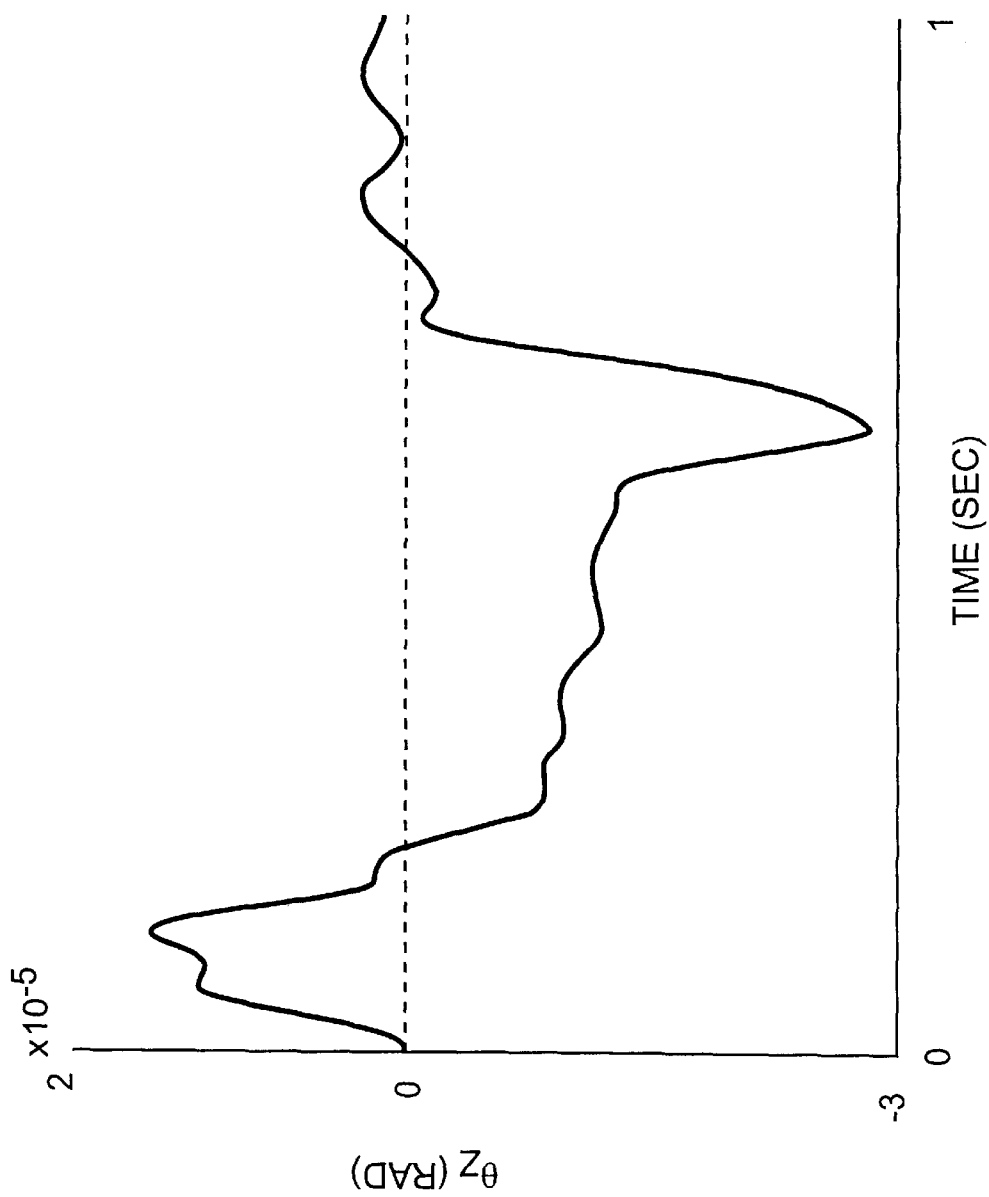
FIG. 3 is a graph showing a simulation of the behavior (yawing) of the exposure apparatus main body when the position of a WX stage is not monitored.
Figure 4:
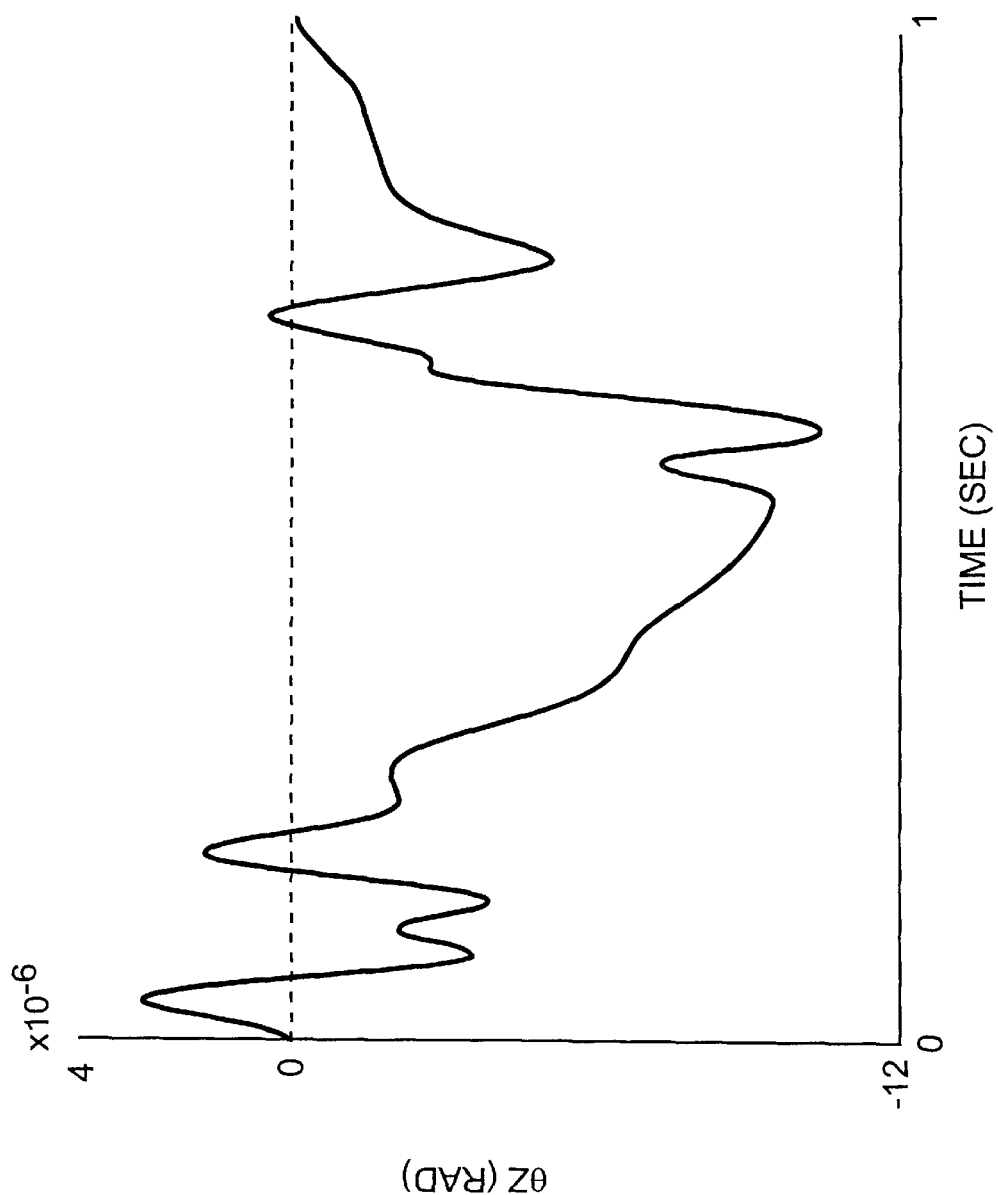
FIG. 4 is a graph showing a simulation of the behavior (yawing) of the exposure apparatus main body when the position of a WX stage is monitored.

Referring to FIGS. 3 and 4, a simulation of the amount of rotation about the Z-axis (yawing) of the exposure apparatus main body 40 is illustrated in FIG. 3 when the position of the WX stage 20X is not monitored, and a simulation of the yawing of the exposure apparatus main body 40 is shown in FIG. 4 when the position of the WX state 20X is monitored. Clearly, the yawing component is larger in FIG. 3 (the position of the WX state 20X is not monitored) than in FIG. 4 (the position of the WX stage 20X is monitored). This results from the fact that the movement of the WX stage 20 causes the position of the center of gravity of the wafer stage 20 (i.e., WX stage 20X+WY stage 20Y) to shift from the center. However, as shown in FIG. 4, by monitoring the position of the WX stage, the counterforce command values are applied more effectively during the stage acceleration or deceleration with a reduced the yawing component regardless of the position of the WX stage.

Figure 5:
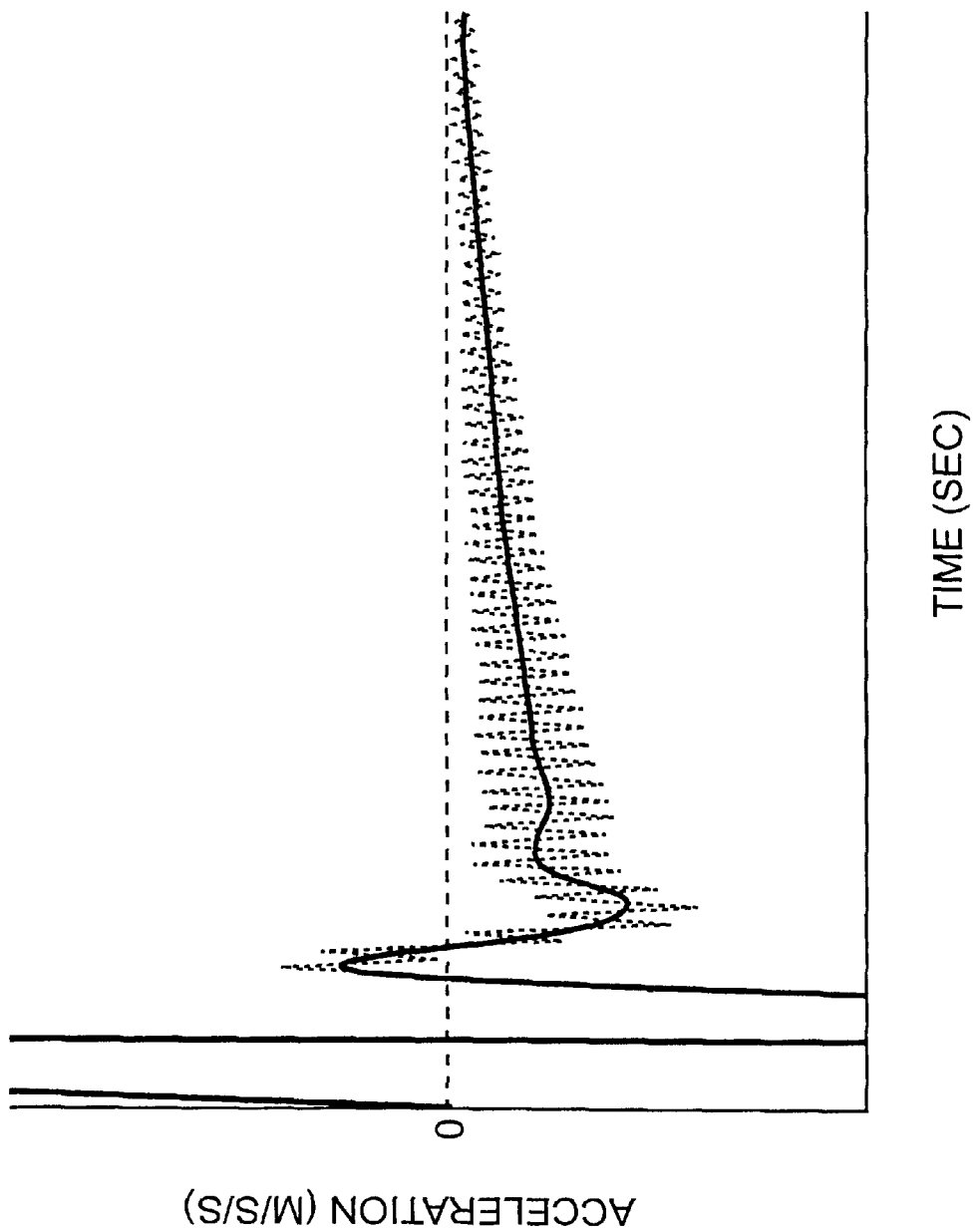
FIG. 5 is a graph showing a simulation of the vibration of the exposure apparatus main body during the stage acceleration.

FIG. 5 shows a simulation of the vibration of the exposure apparatus main body during the stage acceleration. The broken line indicates results obtained without digital filters $G_x$, $G_y$, $G_z$, $G\theta_x$, $G\theta_y$ and $G\theta_z$, and the solid line indicates when the filters were used. As is clear from the FIG. 3, the solid line shows less vibration of the main body than the broken line. This indicates that even if frequency components the same as the mechanical resonance frequency of the main body are contained in the counterforce, counterforce command values during stage acceleration or deceleration is provided more effectively by using digital filters without causing vibration of the main body. The digital filters $G_x$, $G_y$, $G_z$, $G\theta_x$, $G\theta_y$ and $G\theta_z$ are not limited to the positions shown in FIG. 2. For example, it would also be possible to install the filters between the adders $60_1$, $60_2$, $60_3$, $60_4$, $60_5$ and $60_6$ and the counterforce operating part 66.

As described above, in the exposure apparatus 100 during scanning exposure, the wafer stage 20 and reticle stage 27 are scanned along the direction of the Y-axis. When the exposure apparatus main body 40 vibrates as a result of the movement of these stages, the actuators 7A, 7B, 7C, 7D, 32A, 32B and 32C are driven by the vibration control system of the control device 11 based on the outputs of the displacement sensors $10Z_1$, $10Z_2$, $10Z_3$, $10X_1$, $10X_2$ and 10Y and acceleration sensors $5Z_1$, $5Z_2$, $5Z_3$, $5X_1$, $5X_2$ and 5Y. Accordingly, the vibration of the exposure apparatus main body 40 is effectively suppressed. When a stage (for example, the WX stage 20X) moves, the position of the center gravity of the overall stage also varies and deviates from the center. However, the counterforce operating part 66 monitors the position of the WX stage 20X in real time through the interferometers 30X and 30Y measuring the stage position and the amount of deviation from the center. Counterforce command values to suppress the vibration of the exposure apparatus main body caused by the reaction force from stage acceleration or deceleration are fed forward to the vibration control system.

Consequently, the respective actuators are driven by the vibration control system, so that a counterforce canceling the vibration is applied to the exposure apparatus main body 40. The vibration and yawing of the exposure apparatus main body thus is suppressed. Accordingly, the apparatus 100 of the present invention improves the suppression of perturbing vibration regardless of variation in the stage positions. Thus, the conformability of the stages and the precision of synchronization between the reticle stage 27 and wafer stage 20 during scanning exposure is much improved and the synchronization adjustment time is reduced by the present invention. As a result, the precision of exposure and the through-put are improved.

Further, although the vibration isolator of the present invention was applied to a step-and-scan type projection exposure apparatus, it is also appropriately for a stepper type projection exposure apparatus because stages are moved over the base plate in the exposure apparatus.

In the present invention, seven actuators were used to suppress vibration of the exposure apparatus main body in direction with six degrees of freedom. However, the present invention is not limited to such an arrangement. For example, considering the correction of the inclination of the base plate (a vibration isolating stand), 3 Z-direction actuators are sufficient for this purpose.

Further, the counterforce command values to suppress yawing of the apparatus main body is not limited only to cases where vibration of the apparatus main body is in directions with six degrees of freedom. For example, when the stages move across the position of the center of gravity of the apparatus main body, the apparatus main body does not necessarily vibrate in directions with six degrees of freedom. The present invention functions effectively in such cases as well. Therefore, the numbers of displacement sensors and acceleration sensors (vibration sensors) are not limited to six sensors.

It will be apparent to those skilled in the art that various modifications and variations can be made in a projection exposure apparatus having an active vibration isolator and a method of controlling vibration by the active vibration isolator of the present invention without departing from the spirit or scope of the invention. Thus, it is intended the present invention cover modifications and variations of this invention provided they come within the scope of the appended claims and their equivalents.

What is claimed is:

1. A projection exposure apparatus for transferring a pattern on a reticle to a wafer, comprising:

at least three vibration isolating pads;

a vibration isolating stand on the vibration isolating pads;

a plurality of actuators driving the vibration isolating stand in a vertical direction;

at least two stages over the vibration isolating stand, the stages mounting the wafer and the reticle;

at least one displacement sensor at the vibration isolating stand and detecting a displacement of the vibration isolating stand;

at least one acceleration sensor at the vibration isolating stand and detecting acceleration and deceleration of the vibration isolating stand;

a vibration control system coupled to the displacement sensors and the acceleration sensors, and controlling the actuators based on outputs of the displacement sensors and the acceleration sensor;

a position measuring device positioned on the vibration isolating stand and measuring a position of the stages; and a vibration compensating system coupled to the vibration control system and receiving a command value to cancel a reaction force caused by the acceleration and deceleration of the stages in advance.

2. The apparatus according to claim 1, wherein the command value includes a counterforce to suppress the vibration.

3. The apparatus according to claim 1, wherein the command value includes a mechanical resonance frequency component.

4. A projection exposure apparatus for transferring a pattern on a reticle to a wafer, the projection exposure apparatus having an active vibration isolator to isolate the apparatus from an vibration, the apparatus comprising:

a plurality of isolation pads supporting the projection exposure apparatus;

a vibration isolating stand on the isolation pads;

a plurality of actuators driving the vibration isolating stand in a vertical direction, the actuators being below the vibration isolating stand;

a plurality of stages mounting the wafer and reticle over the vibration isolating stand;

a plurality of laser interferometers coupled to the stages and monitoring movements of the wafer and reticle;

a plurality of acceleration sensors detecting an acceleration of the vibration isolating stand, the acceleration sensors positioned at the vibration isolating stand;

a plurality of metal plates at the vibration isolating stand;

a plurality of displacement sensors detecting a displacement of the vibration isolating stand, the displacement sensors facing into the metal plates; and an actuator control system controlling the actuators based on output signals from the displacement sensors and the acceleration sensors.

5. The apparatus according to claim 4, wherein the actuator control system comprises:

a first coordinate conversion part receiving the output signals from the displacement sensors, converting the output signals into a displacement of a center of gravity of the projection exposure apparatus in directions with a plurality of degrees of freedom;

a target value output part outputting target values for positions of the center of gravity of the projection exposure apparatus in directions with the plurality of degrees of freedom;

a plurality of first substrators receiving the displacement from the first coordinate conversion part and the target values for positions of the center of gravity from the target value output part, and substrating the displacement from the target values for positions of the center of gravity;

a plurality of position controllers receiving output signals from the plurality of first substrators and controlling positional deviations of the projection exposure apparatus;

a plurality of conversion gains receiving output signals for the plurality of position controllers and converting the output signals into speed command values;

a second coordinate conversion part receiving the output signals from the acceleration sensors and converting the output signals into an acceleration of a center of gravity of the projection exposure apparatus in directions with the plurality of degrees of freedom;

a plurality of integrators integrating the acceleration from the second coordinate conversion part into a speed of a center of gravity of the projection exposure apparatus in directions with the plurality of degrees of freedom;

a plurality of second substrators receiving the speed from the integrators and from the speed command values from the conversion gains, and substrating the speed from the integrators from the speed command values to obtain speed deviations;

a plurality of speed controllers receiving output signals from the plurality of second substrators and controlling the projection exposure apparatus based on the speed deviations;

a counterforce operating part receiving output signals from the laser interferometers, calculating counterforce command values for the vibrations of the projection exposure apparatus caused by the movement of the stages, and applying a plurality of gains with respect to the direction in the plurality of degrees of freedom;

a plurality of adders receiving the gains from the counterforce operating part, and adding the gains into output signals from the speed controllers;

a non-interference calculating part coupled to the plurality of adders and performing non-interference calculations to convert the speed deviations into the speed command values; and a plurality of driving gains receiving the speed command values from the non-interference calculating part and converting the speed command values into positions of the actuators to be driven.

6. The apparatus according to claim 5, wherein the actuator control system includes a plurality of digital filters coupled to the adders and removing mechanical resonance components.

7. The apparatus according to claim 4, wherein the isolation pads include pneumatic dampers.

8. The apparatus according to claim 4, wherein the actuators each include a fixed element and movable element.

9. The apparatus according to claim 4, wherein the acceleration sensors include one of electrostatic capacitance type semiconductor acceleration sensors or piezo resistance type acceleration sensors.

10. The apparatus according to claim 4, wherein the displacement sensors includes one of eddy current displacement sensors, electrostatic capacitance type non-contacting displacement sensors, or semiconductor optical position detectors.

11. A method of controlling a vibration in a projection exposure apparatus, comprising the steps of:

converting output signals from a plurality of displacement sensors and acceleration sensors into a displacement and acceleration of a center of gravity of the projection exposure apparatus with a plurality of degrees of freedom, respectively;

calculating positional deviations and speed deviations of the projection exposure apparatus based on the displacement and acceleration;

controlling a plurality of actuators through positional and speed controllers based on the positional and speed deviations; and inputting command values in advance into the positional and speed controllers to cancel a reaction force generated by a movement of wafer and reticle stages.

12. The method according to claim 11, wherein the step of calculating the positional deviations includes the steps of:

converting output signals from the positional controllers into speed command values; and subtracting the displacement from the target values for positions of the center of gravity of the projection exposure apparatus.

13. The method according to claim 11, wherein the step of calculating the speed deviations includes the steps of:

converting output signals from a plurality of acceleration sensors into an acceleration of a center of gravity of the projection exposure apparatus with a plurality of degrees of freedom;

integrating the acceleration into a speed of the center of gravity of the projection exposure apparatus; and subtracting the speed from the speed command values.

14. The method according to claim 11, wherein the step of inputting command values includes removing mechanical resonance frequency components from the projection exposure apparatus.

15. An exposure apparatus which exposes a pattern of a mask onto an object, comprising:

an object stage which holds and moves the object;

a first interferometer system that detects a position of the object stage with regard to a first direction;

a second interferometer system that detects a position of the object stage with regard to a second direction different from the first direction;

a mask stage which holds and moves the mask;

a third interferometer system that detects a position of the mask stage with regard to the first direction;

a main body that movably supports the object stage and the mask stage;

an actuator connected to the main body to drive the main body in a third direction different from the first direction and the second direction; and a controller connected to the first, second and third interferometer systems to control the actuator so as to suppress a deviation from the center of gravity of the exposure apparatus based on outputs of the first, second and third interferometer systems.

16. An exposure apparatus according to claim 15, wherein the actuator comprises a fluid actuator and an electric actuator.

17. An exposure apparatus according to claim 16, wherein the controller controls the electric actuator.

18. An exposure apparatus according to claim 15, further comprising a sensor connected to the main body to sense a condition of the main body.

19. An exposure apparatus according to claim 18, wherein the controller controls the actuator based on an output of the sensor.

20. An exposure apparatus according to claim 18, wherein the sensor is a vibration sensor to sense a vibration of the main body.

21. An exposure apparatus according to claim 15, wherein at least a part of the exposure apparatus is made of ceramics.

22. An exposure apparatus according to claim 15, wherein weight of the mask stage is different from weight of the object stage.

23. A positioning device that positions a movable stage, comprising:

a support member that movably supports the movable stage;

a first interferometer system that detects a position of the movable stage with regard to a first direction;

a second interferometer system that detects a position of the movable stage with regard to a second direction different from the first direction;

an actuator connected to the support member to drive the support member in a third direction different from the first direction and the second direction; and a controller connected to the first and second interferometer systems to control the actuator so as to suppress a deviation from the center of gravity of the positioning device based on outputs of the first and second interferometer systems.

24. A positioning device according to claim 23, wherein the actuator comprises a fluid actuator and an electric actuator.

25. A positioning device according to claim 24, wherein the controller controls the electric actuator.

26. A positioning device according to claim 23, further comprising a sensor connected to the support member to sense a condition of the support member.

27. A positioning device according to claim 26, wherein the controller controls the actuator based on an output of the sensor.

28. A positioning device according to claim 26, wherein the sensor is a vibration sensor to sense a vibration of the support member.

29. A positioning device according to claim 23, wherein at least a part of the positioning device is made of ceramics.

30. An exposure method which exposes a pattern of a mask onto an object by using an exposure apparatus, comprising the steps of:

supporting the mask and the object by a main body;

detecting a position of the object with regard to a first direction by a first interferometer system;

detecting a position of the object with regard to a second direction different from the first direction by a second interferometer system;

detecting a position of the mask with regard to the first direction by a third interferometer system;

controlling an actuator that drive the main body in a third direction different from the first direction and the second direction so as to suppress a deviation from the center of gravity of the exposure apparatus based on outputs of the first, second and third interferometer systems; and exposing the pattern onto object during the movement of the mask and the object.

31. An exposure method according to claim 30, wherein the actuator comprises a fluid actuator and an electric actuator.

32. An exposure method according to claim 31, wherein the controlling step is performed by controlling the electric actuator.

33. An exposure method according to claim 30, further comprising sensing a condition of the main body.

34. An exposure method according to claim 33, wherein the actuator is driven based on outputs of first, second and third interferometer systems and a sensing result of the main body.

35. An exposure method according to claim 33, wherein the sensing step senses a vibration of the main body.

36. An exposure method according to claim 30, wherein at least a part of the exposure apparatus is made of ceramics.

37. An exposure method according to claim 30, wherein weight of the mask stage is different from weight of the object stage.

38. A positioning method that positions a movable stage by using a positioning device, comprising the steps of:

supporting the movable stage by a support member;

detecting a position of the movable stage with regard to a first direction by a first interferometer system;

detecting a position of the movable staged with regard to a second direction different from the first direction by a second interferometer system; and controlling an actuator that drives the support member in a third direction different from the first direction and the second direction so as to suppress a deviation from the center of gravity of the positioning device based on outputs of the first and second interferometer systems.

39. A positioning method according to claim 38, wherein the actuator comprises a fluid actuator and an electric actuator.

40. A positioning method according to claim 39, wherein the controlling step is performed by controlling the electric actuator.

41. A positioning method according to claim 38, further comprising sensing a condition of the support member.

42. A positioning method according to claim 41, wherein the actuator is driven based on outputs of first and second interferometer systems and a sensing result of the support member.

43. A positioning method according to claim 41, wherein the sensing step senses a vibration of the support member.

44. A positioning method according to claim 38, wherein at least a part of the positioning device is made of ceramics.

* * * * *